United States Patent [19]

Battersby et al.

[11] Patent Number: 5,258,624
[45] Date of Patent: Nov. 2, 1993

[54] TRANSFERRED ELECTRON EFFECT DEVICE

[75] Inventors: Stephen J. Battersby, Dorking; John M. Shannon, Whyteleafe; Marek Szubert, Bedfont, all of England

[73] Assignee: U.S. Philips Corp., New York, N.Y.

[21] Appl. No.: 899,818

[22] Filed: Jun. 16, 1992

Related U.S. Application Data

[63] Continuation of Ser. No. 697,914, May 1, 1991, abandoned, which is a continuation of Ser. No. 356,039, May 23, 1989, abandoned.

[30] Foreign Application Priority Data

May 27, 1988 [GB] United Kingdom ............... 8812590

[51] Int. Cl.$^5$ ..................... H01L 27/26; H01L 47/00
[52] U.S. Cl. ................................. 257/11; 257/905; 257/26; 257/183.1
[58] Field of Search ............ 357/3, 4, 16, 58, 90, 357/12, 13 U, 13 Z; 257/183.1, 11, 26, 905

[56] References Cited

U.S. PATENT DOCUMENTS

| | | | |
|---|---|---|---|
| 2,772,360 | 11/1956 | Shockley | 357/58 |
| 2,794,917 | 6/1957 | Shockley | 357/58 |
| 2,953,488 | 9/1960 | Shockley | 357/58 |
| 4,396,931 | 8/1983 | Dumke et al. | 357/3 |
| 4,417,261 | 11/1983 | Gray et al. | 357/3 |
| 4,482,910 | 11/1984 | Nishiziwa et al. | 357/58 |
| 4,539,581 | 9/1985 | Malik et al. | 357/3 |
| 4,599,632 | 7/1986 | Bethea et al. | 357/90 |
| 4,649,405 | 3/1987 | Eastman | 357/16 |
| 4,801,982 | 1/1989 | Couch et al. | 357/4 |
| 4,862,238 | 8/1989 | Shannon | 357/16 |
| 4,879,581 | 11/1989 | Diamand | 357/3 |

OTHER PUBLICATIONS

"Anatomy Of The Transferred—Electron Effect In III-V Semiconductors", Ridley, J. Appl. Phys., vol. 48, #2, Feb. 1977, pp. 754-764.

"Transferred-Electron Effect in ImGaAsP Alloys Lattice-Matched to InP", Kowalsky et al., Solid-State Electronics, vol. 28, #3, pp. 299-305 1985.

"Inhibition Of Charge Packet Broadening In GaAs Charge-Coupled Devices", Song et al., Appl. Phys. Lett., vol. 51, #19, Nov. 9, 1987, pp. 1539-1541.

"Physics Of Semiconductor Devices" IEEE Transactions on Electronic Devices Vo. Ed-30, No. 6, Jun. 1983.

"Injection Properties Of Contacts To Inp", Institute Of Physics Conf. Ser. No. 22, pp. 105-115, Rees, 1974.

*Primary Examiner*—William Mintel
*Assistant Examiner*—Mahshid Saadat
*Attorney, Agent, or Firm*—Steven R. Biren

[57] ABSTRACT

A transferred electron effect device has a semiconductor body with an active region (2) of n conductivity type formed of a semiconductor material having a relatively low mass, high mobility conduction band main minimum and at least one relatively high mass, low mobility conduction band satellite minimum, and an injection zone (3) adjoining the active region (2) for causing electrons to be emitted, under the influence of an applied electric field, from the injection zone (3) into the active region (2) with an energy comparable to that of the relatively high mass, low mobility, conduction band satellite minima of the active region. The injection zone (3) is formed by first and second n conductivity type regions (4 and 5) separated by a barrier region (6) which has an impurity concentration characteristic of the p conductivity type and which is sufficiently thin as to be fully depleted of free charge carriers under zero bias, at least one of the first and second regions (4) being highly doped relative to the active region at least adjacent the barrier region and the barrier region (6) having an impurity concentration sufficient to provide a potential barrier (P) to the flow of electrons of a height such that in operation of the device, electrons with sufficient energy to surmount the potential barrier (P) provided by the barrier region (6) are emitted into the active region (2) with an energy comparable to that of a conduction band satellite minimum of the active region (2).

10 Claims, 2 Drawing Sheets

TRANSFERRED ELECTRON EFFECT DEVICE

This is a continuation of application Ser. No. 07/697,914, filed May 1, 1991 which is a continuation of Ser. No. 356,039 filed May 23, 1989, both abandoned.

BACKGROUND OF THE INVENTION

This invention relates to a transferred electron effect device comprising a semiconductor body having an active region of n conductivity type formed of a semiconductor material having a relatively low mass, high mobility conduction band main minimum and at least one relatively high mass, low mobility conduction band satellite minimum and an injection zone adjoining the active region for causing electrons to be emitted, under the influence of an applied electric field, from the injection zone into the active region with an energy comparable to that of a relatively high mass, low mobility conduction band satellite minimum of the active region.

The transferred electron effect is discussed in detail in Chapter 11, pages 637 to 767 of the text book 'Physics of Semiconductor Devices', Second Edition, by S. M. Sze published in 1981 by John Wiley and Sons Inc. of New York. Briefly, in certain semiconductor materials such as gallium arsenide or indium phosphide the application of an electric field greater than a threshold or critical field enables transfer of electrons from the relatively low mass, high mobility conduction band main minimum ($\Gamma$) to a relatively high mass, low mobility conduction band satellite minimum ((L) for gallium arsenide or indium phosphide) so that the semiconductor material exhibits a bulk negative differential resistance, allowing charge instabilities to grow to form accumulation or dipole layers. Semiconductor materials exhibiting such a bulk negative differential resistance can, as first observed by Gunn and as discussed in the aforementioned Chapter of the text book by Sze, be used to form devices which, when a dc electric field greater than the critical field is applied, generate a coherent microwave output.

As will be appreciated from the above, in order to enable electrons to be transferred to a relatively high mass, high energy, low mobility satellite minimum (L) to obtain the negative differential resistance characteristic, sufficient energy must be imparted to the electrons by the applied electric field. Conventionally, a transferred electron effect device comprises a relatively lowly doped n-conductivity type active region, for example an active region with a dopant concentration of about $1 \times 10^{16}$ atoms cm$^{-3}$, of an appropriate semiconductor material, for example gallium arsenide or indium phosphide, with relatively highly doped n-conductivity type regions being provided at opposed surfaces of the active region to enable ohmic contact to cathode and anode electrodes across which the electric field is to be applied. With such a conventional ohmic contact structure, electrons accelerated by the electric field do not achieve sufficient energy to transfer to the satellite minima until they have traversed a given distance along the semiconductor body between the cathode and anode contacts. Thus, in such a conventional ohmic contact structure, the injection zone comprises a part of the active region and forms an acceleration zone in which the electrons in the main conduction band minima are heated. Accordingly, the accumulation or dipole layers which result in the microwave oscillation grow some distance from the cathode and there is in effect a dead zone within the device. For a given applied electric field, the length of the acceleration zone is effectively fixed while the frequency of the microwave output is inversely proportional to the length of the device. Accordingly, as demand occurs for devices capable of providing higher and higher frequency microwave outputs, the proportion of the length of the device taken up by the acceleration zone or dead zone increases, adversely affecting device performance and efficiency.

Various methods have been proposed for facilitating the acceleration of electrons into the relatively high mass, low mobility high energy satellite minima (L). In particular, it has been proposed that the field at the cathode may be increased by providing a notch in the doping profile adjacent the cathode as described in, for example, an article entitled 'Monte Carlo simulation of a Millimeter-wave Gunn-effect Relaxation Oscillator' by John W. Tully published in the IEEE Transactions on Electronic Devices Volume ED-30 No. 6, June 1983 at pages 566 to 571.

However, although the use of a cathode notch may reduce the length of the dead zone, the dead zone is not eliminated and the device still relies on the same basic essentially diffusive heating mechanism to impart the necessary energy to the electrons. Furthermore, the potential drop across the relatively lowly doped cathode notch is large so that although the length of the dead zone may be reduced, the field is increased. As will be appreciated, the power losses in a device are equal to the product IV of the current and applied voltage. In order to reduce power losses for a given current I, the voltage V must be reduced. Although the necessary applied voltage is reduced by using a cathode notch, the advantage gained in practice is less than might be expected from the reduction in the length of the dead zone.

Another proposal has been to replace the ohmic cathode contact with a reverse-biased Schottky contact as described in, for example, an article entitled 'Injection Properties of Contacts to InP' by H. Rees published in the Institute of Physics Conference Series, No. 22, at pages 105 to 115 (1974). However, for such Schottky barrier injection zones to be effective, it is necessary for Schottky barriers to be prepared which have a barrier height considerably lower than the normal Schottky barrier height which is pinned by surface states and shows only a weak dependence on the work function of the metallic cathode contact or electrode. Unfortunately, the preparation of such Schottky barriers either by contact processing or by use of doped surface layers has proved unreliable, particularly where the semiconductor body comprises a gallium arsenide body.

SUMMARY OF THE INVENTION

According to one aspect of the present invention, there is provided a transferred electron effect device comprising a semiconductor body having an active region of n conductivity type formed of a semiconductor material having a relatively low mass, high mobility conduction band main minimum and at least one relatively high mass, low mobility conduction band satellite minimum, and an injection zone adjoining the active region for causing electrons to be emitted, under the influence of an applied electric field, from the injection zone into the active region with an energy comparable to that of a relatively high mass, low mobility, conduction band satellite minimum of the active region, characterized in that the injection zone comprises first and second n conductivity type regions separated by a barrier region which has an impurity concentration characteristic of the p conductivity type and which is sufficiently thin as to be fully depleted of free charge carriers under zero bias, at least one of the first and second regions being highly doped relative to the active region at least adjacent the barrier region and the barrier region having an impurity concentration sufficient to provide a potential barrier to the flow of electrons of a height such that, in operation of the device, electrons with sufficient energy to surmount the potential barrier provided by the barrier region are emitted into the active region with an energy comparable to that of a conduction band satellite minimum of the active region.

Thus, in a transferred electron effect device in accordance with the invention, the injection zone makes use of a potential barrier which is provided within the bulk of the semiconductor and is not constrained by the effect of Fermi pinning by surface states. Furthermore, the height of the potential barrier defined by the barrier region may be adjusted relatively simply and easily by altering the doping of the barrier region.

The first region may, at least adjacent the barrier region, be more highly doped than the second and active regions and may adjoin the active region. The second region may comprise first and second subsidiary regions and the second subsidiary region may be spaced from the barrier region and be more highly doped than the active region and the first subsidiary region.

In accordance with a second aspect of the present invention, there is provided a transferred electron effect device comprising a semiconductor body having an n conductivity type active region adjacent an anode of the device and formed of a semiconductor material having a relatively low mass, high mobility conduction band main minimum and at least one relatively high mass, low mobility conduction band satellite minimum, and an injection zone adjacent a cathode of the device and adjoining the active region for causing electrons to be emitted, under the influence of a potential difference applied between the anode and the cathode to provide at least a threshold electric field in the active region, from the injection zone into the active region with an energy comparable to that of a relatively high mass, low mobility, conduction band satellite minimum of the active region, characterized in that the injection zone comprises a first n conductivity type region adjoining the active region and separated by a barrier region from a second n conductivity type region comprising first and second subsidiary regions, the second subsidiary region being spaced from the barrier region by the first subsidiary region, the first region and the second subsidiary region being more highly doped than the first subsidiary region and the active region, and the barrier region being sufficiently thin as to be fully depleted of free charge carriers under zero bias and having an impurity concentration characteristic of the p conductivity type sufficient to provide a potential barrier to the flow of electrons of a height comparable in energy to the energy difference between the main and satellite conduction band minima of the active region with the first region being sufficiently thin that, in operation of the device when the potential difference is applied between the anode and cathode, electrons are thermionically emitted over the potential barrier into the active region with an energy comparable to that of a satellite conduction band minimum of the active region.

The injection zone of this device forms a camel diode as described in, for example, GB-A-1573309 and GB-A-1573310 and in a paper entitled "A new majority carrier diode—the camel diode", by J. M. Shannon, published in the proceedings of the Eleventh Conference (1979 International) on solid state devices, Tokyo 1979, Japanese Journal of Applied Physics Vol. 19 (1980) Supplement 9-1 at pages 301 to 304. In operation of the device, when the potential difference is applied to enable a field greater than the threshold or critical field to be established in the active region, the camel diode is forward biassed and the energy of the electron distribution in the relatively lowly doped first subsidiary region is raised, facilitating thermionic emission of electrons over the potential barrier defined by the barrier region. The first region is sufficiently thin that no significant thermalization of the thermionically emitted electrons occurs and accordingly electrons are emitted over the barrier into the active region with an energy comparable to that of the conduction band satellite minima enabling the active region to exhibit a negative differential resistance and so facilitating use of the device as, for example, a microwave oscillator without the need for a relatively long high field acceleration zone or dead space.

Alternatively, the second region may adjoin the active region and comprise first and second subsidiary regions, the second subsidiary region being spaced from the barrier region by the first subsidiary region, the first region and the second subsidiary region being more highly doped than the first subsidiary region and the active region. The injection zone again forms a camel diode, but in this example the camel diode is reverse-biassed in operation of the device. The reverse-biassing of the camel diode pulls down the potential barrier to some extent, enabling an increased flow of electrons over the potential barrier and, in this case, the camel diode serves to establish a relatively short high field region subsidiary region which further heats or accelerates electrons passing over the potential barrier defined by the barrier region, so enabling electrons with an energy comparable to that of the conduction band satellite minima of the active region to be emitted into the active region, facilitating the exhibition by the active region of a negative differential resistance and so the use of the device as, for example, a microwave oscillator.

In either case, the doping of the active region may be uniform or, alternatively, the doping of the active region may be graded so as to decrease towards the injection zone, thereby increasing the electric field towards the injection zone and contributing to improved device efficiency.

It should be noted that U.S. Pat. No. 4,539,581 describes a transferred electron effect device having an injector zone in the form of a planar doped barrier diode which consists of a relatively narrow highly doped p+ planar region located between two relatively thicker $\pi$ regions which comprise planar regions of very low doped p− type semiconductivity so that substantially undoped regions are provided. The $\pi$ regions are bounded by two heavily doped n+ conductivity type regions. The planar doped barrier diode operates to accelerate electrons in order to transfer them to a relatively high energy low mobility satellite minima. The barrier height provided by the planar doped barrier diode is determined by the space charge density in the p+ planar region and the thickness of the $\pi$ regions which increase the overall length of the device and may result in thermalization cooling of the electrons requiring the use of a higher barrier or an acceleration zone to enable the electrons to be emitted over the barrier with an energy comparable to that of the satellite minima. In addition, the device described in U.S. Pat. No. 4,539,581 may not be operable at high current densities because of space-charge limiting of the current resulting from the presence of the lowly doped $\pi$ regions.

BRIEF DESCRIPTION OF THE DRAWING

Embodiments of the invention will now be described, by way of example, with reference to the accompanying drawing, in which.

Figure 1:
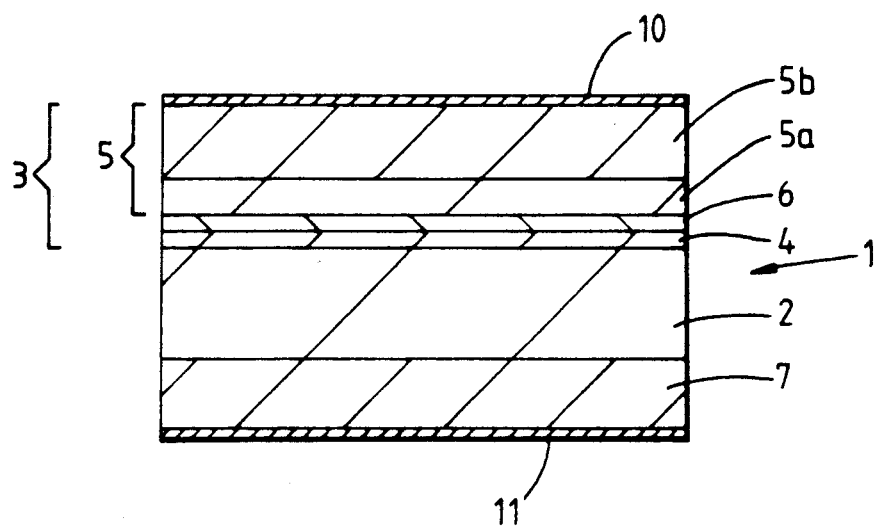
FIG. 1 is a schematic cross-sectional view of one embodiment of a transferred electron effect device in accordance with the invention.

It should be understood that the Figures are merely schematic and are not drawn to scale. In particular the thickness of certain layers or regions has been relatively exaggerated while the thickness of other layers or regions has been relatively reduced in the interests of clarity. It should also be understood that the same reference numerals are used throughout the Figures to indicate the same or similar parts.

DESCRIPTION OF THE PREFERRED EMBODIMENTS

Figure 3:
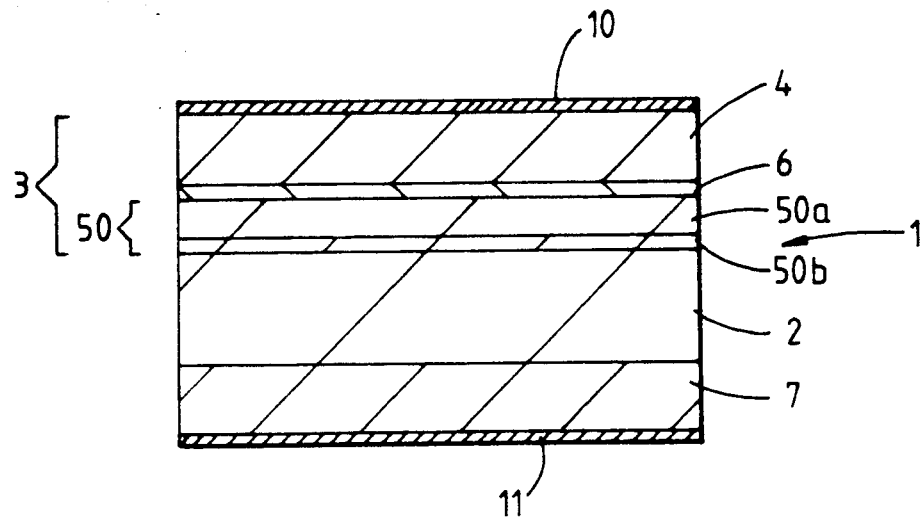
FIG. 3 is a schematic cross-sectional view of another embodiment of a transferred electron effect device in accordance with the invention.

Referring now to the drawings, as shown in FIGS. 1 and 3, a transferred electron device comprises a semiconductor body 1 having an active region 2 of n conductivity type formed of a semiconductor material having a relatively low mass, high mobility conduction band main minimum ($\Gamma$) and at least one relatively high mass, low mobility conduction band satellite minimum ((L) for gallium arsenide or indium phosphide) and an injection zone 3 adjoining the active region 2 for causing electrons to be emitted, under the influence of an applied electric field, from the injection zone 3 into the active region with an energy comparable to that of a relatively high mass, low mobility conduction band satellite minimum of the active region 2. In accordance with the invention, the injection zone 3 comprises first and second n conductivity type regions 4 and 5 separated by a barrier region 6 which has an impurity concentration characteristic of the p conductivity type and which is sufficiently thin as to be fully depleted of free charge carriers under zero bias, at least one of the first and second regions 4 and 5 being highly doped relative to the active region at least adjacent to the barrier region 6 and the barrier region 6 having an impurity concentration sufficient to provide a potential barrier to the flow of electrons of a height such that, in operation of the device, electrons with sufficient energy to surmount the potential barrier provided by the barrier region 6 are emitted into the active region 2 with an energy comparable to that of a conduction band satellite minimum of the active region 2, thus enabling the active region 2 to exhibit a resistance characteristic and enabling, as will be described below, an oscillatory output from the device, for example microwave oscillation.

In a first embodiment illustrated in FIG. 1, the first region 4 adjoins the active region 2 and the second region 5 comprises first and second subsidiary regions 5a and 5b. The second subsidiary region 5b is spaced from the barrier region 6 by the first subsidiary region 5a and the first region 4 and the second subsidiary region 5b are more highly doped than the first subsidiary region 5a and the active region 2, the barrier region 6 having an impurity concentration sufficient to provide a potential barrier to the flow of electrons of a height comparable in energy to the energy difference between the main and satellite conduction band minima of the active region 2 with the first region 4 being sufficiently thin that, in operation of the device, electrons are thermionically emitted over the potential barrier P into the active region 2 with an energy comparable to that of the satellite conduction band minima of the active region 2.

Referring now specifically to the transferred electron effect device shown in FIG. 1, the semiconductor body 1 comprises a monocrystalline gallium arsenide region or substrate 7 which is highly doped with n conductivity type impurities. The gallium arsenide substrate 7 may have a thickness of about 1.5 micrometers and may be doped with silicon atoms so as to have impurity concentration of about $5 \times 10^{18}$ atoms cm$^{-3}$. Because the substrate 7 is relatively thin, in practice as is known in the art, the substrate 7 will normally be formed as an epitaxial layer on top of an aluminum gallium arsenide layer (not shown) provided on a gallium arsenide wafer. After the device has been formed as will be described below, a heat sink is provided on the top surface, that is at the cathode electrode 10, and the gallium arsenide wafer selectively etched away using the aluminum gallium arsenide layer as an etch stop. After the gallium arsenide wafer has been removed, a different etchant can then be used to selectively etch away the aluminum gallium arsenide to expose the substrate 7 and enable formation of the anode contact or electrode 11.

The active region 2 is provided on the substrate 7 as an epitaxial layer of n conductivity type gallium arsenide using a layer-by-layer growth technique such as molecular beam epitaxy (MBE), metal organic vapor phase epitaxy (MOVPE) or metal organic MBE. In this example, the layer-by-layer growth is carried out using conventional molecular beam epitaxy techniques in, for example, a Varian Gen II MBE machine manufactured by Varian Associates of Palo Alto, Calif. The active region 2 has, in this example, a thickness of 2.1 micrometers and a dopant concentration of $1.2 \times 10^{16}$ atoms cm$^{-3}$.

The first region 4 and the barrier region 6 are then formed sequentially using the same layer-by-layer growth technique. In this example, the first region 4 is a gallium arsenide epitaxial layer highly doped with n-type impurities, again silicon, and may have a thickness of, for example, 10.2 nm (nanometers) and a dopant concentration of $5 \times 10^{18}$ atoms cm$^{-3}$ while the barrier region 6 is a gallium arsenide epitaxial layer highly doped with p-type impurities, in this example beryllium atoms, and may have a thickness of, for example, 15.8 nm and a dopant concentration of, for example, $3.5 \times 10^{18}$ atoms cm$^{-3}$.

The second region 5 is provided using the same growth technique on the barrier region as an n-conductivity type epitaxial layer of gallium arsenide. As mentioned above in the arrangement shown in FIG. 1, the second region 5 comprises first and second subsidiary regions 5a and 5b. The first subsidiary region 5a is relatively lowly doped having, for example, a dopant concentration of $1.2 \times 10^{16}$ atoms cm$^{-3}$ and has a thickness of, in this example, 0.102 micrometers while the second subsidiary region 5b is relatively highly doped having, for example, a dopant concentration of $5 \times 10^{18}$ atoms cm$^{-3}$ and has, in this example, a thickness of 1.5 micrometers.

Electrically conductive layers, for example of a eutectic AuGe alloy containing 5% by weight of nickel, are deposited onto opposed surfaces of the semiconductor body 1 to provide electrodes 10 and 11 to form the cathode and anode, respectively, of the transferred electron effect device. Doping of the substrate 7 and the second subsidiary region 5b is sufficiently high to provide ohmic contact to the electrodes 10 and 11. The thickness of the second subsidiary region 5b is, in this example, not important but should be sufficient to enable provision of an ohmic contact without the possibility of diffusion of the contact material into the relatively lowly doped first subsidiary region 5a.

Figure 2:
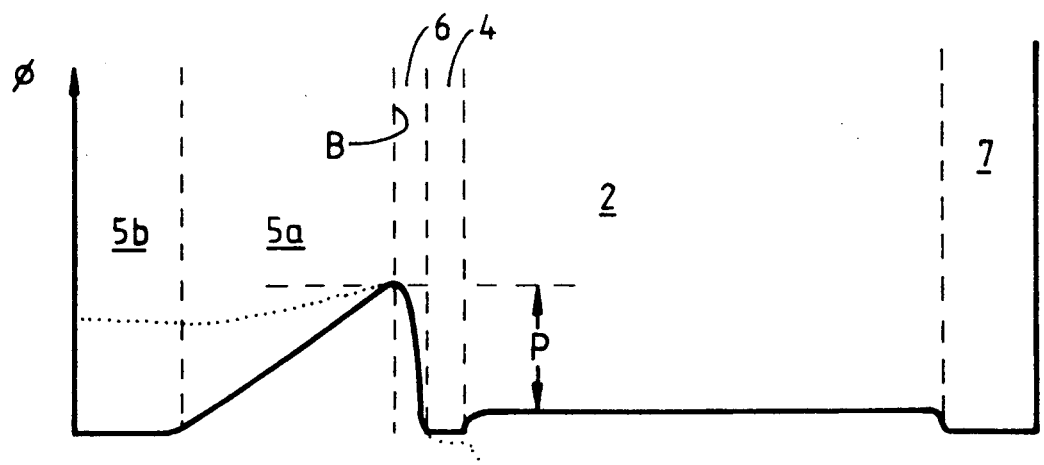
FIG. 2 is a potential diagram for the transferred electron effect device shown in FIG. 1.

FIG. 2 is a potential diagram for the transferred electron effect or Gunn device shown in FIG. 1 and the solid line illustrates the change in potential energy of the conduction band across the various regions of the transferred electron effect device under zero bias with the various regions being referenced by the same reference numerals used in FIG. 1 and being shown separated by vertical dashed lines in FIG. 2.

As indicated above, the barrier region 6 is sufficiently thin so as to be fully depleted of free charge carriers under zero bias (and therefore also in operation of the device) because of the merging of the depletion layers formed at the junctions with the first and second regions 4 and 5 and thus defines a potential barrier P to the flow of electrons between the first and second regions 4 and 5. As commonly understood in the semiconductor art, a semiconductor region (such as the region 6) is said to be substantially depleted of charge carriers of both conductivity types when the number of mobile charge carriers of both conductivity types is negligible (usually for example at least two orders of magnitude less) compared with that of the net impurity concentration in said region. The presence of the negative space region introduces band bending and, as shown in FIG. 2, thus defines the potential barrier P to the flow of electrons between the first and second regions 4 and 5. The first and second regions 4 and 5 and the barrier region 6 thus form a camel diode as described, for example, in GB-A-1573309 and GB-A-1573310 and in a paper entitled "A new majority carrier diode—the camel diode" by J. M. Shannon published in the proceedings of the Eleventh Conference (1979 International) on solid state devices, Tokyo 1979, Japanese Journal of Applied Physics Vol. 19 (1980) Supplement 9-1 at pages 301 to 304.

As can be seen from FIG. 2, because of the fact that the first subsidiary region 5a of the second region 5 is more lowly doped than the first region 4, the potential barrier P is asymmetric with the maximum of the potential barrier lying close to the boundary B between the first subsidiary region 5a and the barrier region 6.

In accordance with the invention, the thickness and dopant concentration of the barrier region 6 are selected so that the potential barrier P defined by the barrier region 6 has a peak height in electron volts (eV) comparable with the difference in electron volts between the main ($\Gamma$) and satellite (L) conduction band minima of the material forming the active region 2. In this example where the active region 2 is formed of gallium arsenide, then the lower or main conduction band minima ($\Gamma$) at k=0 lies 0.31 eV (electron volts) below the satellite minima which are located along the <111> axes (L) and the doping and thickness of the barrier region 6 as given above are selected so that the potential barrier has a peak height of about 0.4 eV.

In use of the transferred electron effect device shown in FIG. 1, a potential difference is applied between the cathode and anode electrodes or contacts 10 and 11 so as to maintain in the active region 2 an electric field in excess of the threshold or critical field which for gallium arsenide is typically 3.5 KV/cm (kilovolts per centimeter) and so as to enable electrons to be emitted from the injection zone 3 into the active region 2, that is with the cathode negatively biased with respect to the anode. As mentioned above, and as shown in FIG. 2, the potential barrier is asymmetric because of the difference in dopant concentration between the first region 4 and the first subsidiary region 5a. Thus, with the electric field applied as indicated above so that the relatively lowly doped first subsidiary region 5a is negatively biased with respect to the more highly doped first region 4, the camel diode formed by the regions 4, 5 and 6 is in effect forward biased and the energy of the electron distribution in the relatively lowly doped first subsidiary region 5a is thus raised, facilitating flow of electrons over the potential barrier P. The potential change across the injection zone is illustrated schematically by the dotted line in FIG. 2. As will be appreciated, when the field across the active region 2 exceeds the threshold or critical field, the potential drop across the active region 2 will be very large. Therefore, in the interests of conciseness in the Figures, the dotted line has been terminated just inside the active region 2.

Electrons with an energy in electron volts comparable to that of the potential barrier P and thus to that of the conduction band satellite minima (L) are thus emitted into the active region 2, the first region 4 being sufficiently thin to prevent appreciable thermalization of the hot electrons before the hot electrons reach the active region 2. Thus, electrons which are sufficiently hot, that is have sufficient energy, to transfer into the conduction band satellite minima (L) of the relatively high field active region 2 and so enable the active region to exhibit a negative differential resistance are emitted directly into the active region 2 without the need for part of the relatively high field active region to act as an acceleration or dead zone. As indicated above, the first region 4 should be sufficiently thin to prevent appreciable thermalization of the hot electrons. A typical thermalization time for a III-V semiconductor material such as gallium arsenide is given in a paper by B. K. Ridley entitled 'Anatomy of the Transferred Electron Effect in 3-5 Semiconductors' published in the Journal of Applied Physics, Volume 48 No. 2, February 1977 at pages 754 to 764, 1977 as:

$$\frac{1}{\tau_{\epsilon eff}} = \frac{1}{\tau_\epsilon} \frac{n_\Gamma}{n_\Gamma + n_L}$$

where $\tau_\epsilon$ is the thermalization time for electrons in the main conduction band minimum ($\Gamma$), typically 0.03 picoseconds for gallium arsenide and $n_\Gamma$ and $n_L$ are, respectively, the $\Gamma$ and L. As the distribution of the emitted electrons between the main and satellite conduction band minima $\Gamma$ and L is not accurately known, it is assumed here that the ratio $n_\Gamma:n_L$ is given by the ratio of the density of states $d_\Gamma$ and $d_L$ in the main and satellite conduction band minima Γ and L leading to an enhanced thermalization time $\tau_{\epsilon eff}$ of about 3 picoseconds. Assuming a diffusion coefficient $\mu KT/q$ where K is Boltzmann's constant, T the average electron temperature, q the quantity of charge and $\mu$ the mean mobility then for a heavily n conductivity doped first region 4 of gallium arsenide with a mean mobility $\mu = 0.2$ m$^2$/Vs, a thermalization length of 120 nanometers can be deduced. Accordingly, the first region 4 should be thinner than 120 nanometers and indeed in the example given above the first region 4 is only 10 nanometers thick, but should be thick enough to avoid penetration of the depletion region into the active region 2.

With the transferred electron device placed in an appropriate microwave cavity as is conventional in the art, then microwave oscillations can be extracted from the device. As is known in the art, the fundamental frequency of the oscillation is approximately equal to the reciprocal of the carrier transit time across the active region, that is the frequency of the output is related to the time taken for an accumulation or dipole layer to traverse the active region 2, and for the dimensions given above, then the device should have a fundamental oscillation frequency in the region of 47 GigaHertz (GHz).

Transferred electron effect or Gunn devices similar to that shown in FIG. 1 and described above have been fabricated which, when a microwave output is extracted, using conventional techniques, at the second harmonic of the fundamental oscillator frequency, provide higher power and at greater efficiency than conventional ohmic contact transferred electron effect devices. Thus, for example, transferred electron effect devices in accordance with the invention having a structure similar to that shown in FIG. 1 with an active region uniformly doped with a dopant concentration of $1.2 \times 10^{16}$ atoms cm$^{-3}$ and a length of 1.8 $\mu$m (micrometers) and with a barrier height measured to be 0.4 electron volts have been fabricated which, when operated in second harmonic mode at 83 GHz, have been observed to have a threshold voltage of 1.8 eV and a current density of 20,000 A cm$^{-2}$ and to provide a power output of 70 milliwatts with an efficiency of 2.0 per cent. A similar device when operated in second harmonic mode at 94 GHz was found to have an output power of greater than 40 mW.

A comparable conventional ohmic contact transferred electron effect or Gunn effect device, that is a device which, apart from the highly doped regions necessary to enable ohmic contact, has a constant doping of about $1.2 \times 10^{16}$ atoms cm$^{-3}$ and a length of 2.1 $\mu$m, was observed to have, at best, an output power of 20 milliwatts with an efficiency of 0.4 per cent at 94 GHz. Similar devices but having an active region which was graded so that the doping at one end of the active region was twice that at the other were found to have an output power of about 30 mW for a device of the type shown in FIG. 1 and an output power of about 25 mW for a conventional ohmic contact device.

In addition, a transferred electron effect device in accordance with the invention may enable a reduction in FM noise because the position within the device at which nucleation of dipole or accumulation layers occurs and so the frequency of the output pulses caused by the propagation of these charge layers should be more precisely determined or reproducible.

The height of the barrier provided by the forward-biased camel diode injection zone 3 is relatively insensitive to bias. Moreover, the forward-biased camel diode injection zone should have an ideality factor close to one so that the potential which needs to be applied to achieve a desired threshold field in the active region 2, and thus the dc power which needs to be input to the device to achieve good efficiency, should be lower than would be required, for example, with the device described in U.S. Pat. No. 4,539,581 where the injection zone is in the form of a planar doped barrier diode which has a much higher ideality factor than a camel diode and so should require a much higher dc power input to achieve an equivalent threshold field in the active region 2.

FIG. 3 illustrates schematically an alternative form of a transferred electron effect device in accordance with the invention where the second region 50 adjoins the active region 2 and comprises first and second subsidiary regions 50a and 50b, the second subsidiary region 50b being spaced from the barrier region 6 by the first subsidiary region 50a and the first region 4 and the second subsidiary region 50b being more highly doped than the first subsidiary region 50a and the active region 2.

The device shown in FIG. 3 is manufactured using the layer-by-layer technique described above so as to form a monocrystalline gallium arsenide semiconductor body 1. Thus, as is the case for the device shown in FIG. 1, the active region 2 is provided as a lowly doped n conductivity type gallium arsenide epitaxial layer on the relatively highly doped n conductivity type monocrystalline gallium arsenide substrate 7. The substrate 7 and active region 2 may be of the same thickness and have the same dopant concentration as in the example given above with reference to FIGS. 1 and 2.

As will be understood from the above, after formation of the active region 2, the structure of the transferred electron effect device shown in FIG. 3 differs from that shown in FIG. 1. Thus, as shown in FIG. 3, the second region 50 is provided on top of the active region 2 as an n conductivity type gallium arsenide epitaxial layer so that the first relatively lowly doped subsidiary region 50a is spaced from the active region 2 by the second relatively highly doped subsidiary region 50b. In this example the first subsidiary region 50a may have a dopant concentration of $1.2 \times 10^{16}$ atoms cm$^{-3}$ and a thickness of 0.102 micrometers while the second subsidiary region 50b may have a dopant concentration of $5 \times 10^{18}$ atoms cm$^{-3}$ and a thickness of 10.2 nm.

The first subsidiary region 50a is followed by the barrier region 6 which is provided, as in the structure shown in FIG. 1, as a p-conductivity type gallium arsenide epitaxial layer with a thickness of about 15.8 nm and a dopant concentration of about $3.5 \times 10^{18}$ atoms cm$^{-3}$. The barrier region 6 is followed by the first region 4 which, in this example, is formed as a highly doped n-conductivity type gallium arsenide epitaxial layer with a thickness of about 1.5 micrometers and a dopant concentration of about $5 \times 10^{18}$ atoms cm$^{-3}$. Electrodes or anode and cathode contacts 10 and 11 are provided in a similar manner to the device shown in FIG. 1.

Figure 4:
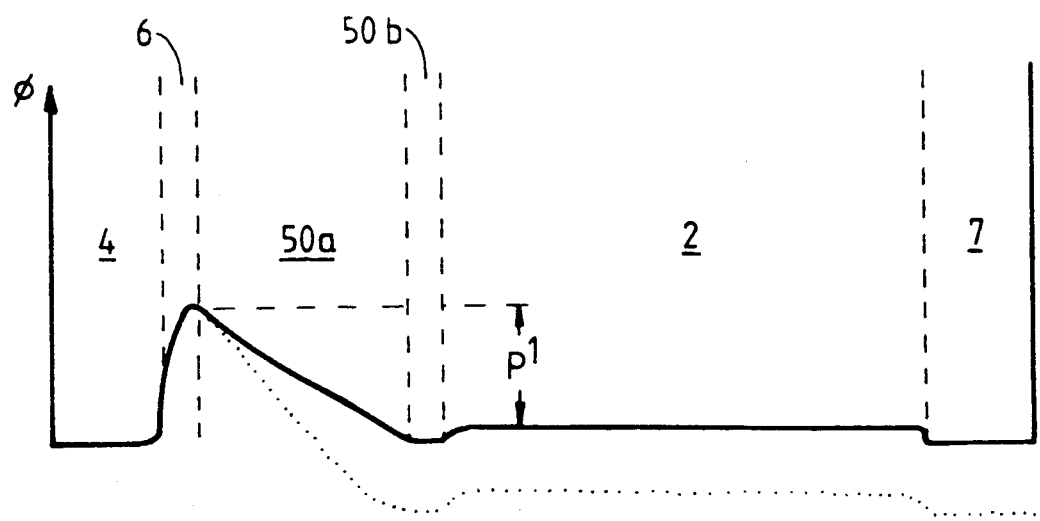
FIG. 4 is a potential diagram for the transferred electron effect device shown in FIG. 3.

FIG. 4 is a potential diagram of the conduction band edge similar to FIG. 2 but for the device structure shown in FIG. 3 indicating in solid lines the potential changes across the device under zero bias.

As will be appreciated from a comparison of FIGS. 3 and 4 with FIGS. 1 and 2, the camel diode formed by the barrier region 6 and first and second regions 4 and 5 in the device of FIG. 3 is in effect reversed compared to that of the device structure shown in FIG. 1. That is, in the device structure shown in FIG. 3, the more lowly doped first subsidiary region 50a is placed on the anode electrode 11 side of the barrier region 6 while in the device structure shown in FIG. 1 the more lowly doped first subsidiary region 50a is placed on the cathode electrode 10 side of the barrier region 6. Accordingly, when an electric field is applied across the cathode and anode contacts 10 and 11 so as to enable electrons to be emitted from the injection zone 3 into the active region 2 the camel diode formed by the barrier region 6 and first and second regions 4 and 50 is effectively reverse-biased, that is the boundary between the barrier region 6 and the relatively lowly doped first subsidiary region 50a is reverse-biased.

The effect of the reverse-biasing of the camel diode is indicated schematically in FIG. 4 for a reverse-bias which is sufficiently low that the field across the active region 2 is negligible. In practice, when a potential is applied across the cathode and anode electrodes 10 and 11 which is sufficient to provide a field greater than the threshold field in the active region 2, the potential barrier P' is pulled down to some extent by the reverse-biasing. As a result there are more electrons which are sufficiently hot to pass over the potential barrier P' and therefore the current passing over the potential barrier P' under the reverse-biasing of the camel diode will be increased because, as indicated above, the reverse-biasing in operation of the device lowers the potential barrier P'.

In operation of the device shown in FIG. 3, the potential barrier P' defined by the barrier region 6 and the second subsidiary region 50b serve to ensure that the relatively lowly doped first subsidiary region 50a acts as a short relatively high field region which causes the electrons which have passed over the potential barrier P' and will therefore already be somewhat hotter than the cathode, to be accelerated and thus further heated so that again electrons are emitted from the injection zone 3 into the active region 2 with an energy comparable to that of the conduction band satellite minima L. This enables the active region 2 to exhibit a negative differential resistance characteristic and, as in the device shown in FIG. 1, enables nucleation of instabilities and growth of accumulation and dipole layers, resulting in an oscillatory output which, when the device is placed in the appropriate microwave cavity as is conventional in the art, can generate a microwave output.

Although in the device structure shown in FIG. 1, the first region 4 is intended to be sufficiently highly doped and thick (while not being sufficiently thick to allow thermalization of the hot electrons before entry into the active region 2) to prevent the depletion region of the pn junction between the barrier region 6 and the first region 4 extending into the active region 2, this need not necessarily be the case. Indeed, the first region 4 may be made sufficiently thin that at certain applied bias potentials the depletion region may extend into the active region 2. As will be appreciated, in contrast to the arrangement described above with reference to FIG. 1, this would have the effect of making the height of the potential barrier defined by the barrier region 6 very bias dependent so that the energy of the electrons passing over the potential barrier would also be very bias dependent. Such a device could be tuned to provide a feedback effect with the microwave output of the device which in practice impresses an AC component on the dc potential bias applied across the electrodes 10 and 11 in effect adjusting the height of the potential barrier. In this case, the barrier region 6 should be such that, during the positive half cycle of the AC component, the height of the potential barrier provided by the barrier region 6 is such that electrons emitted over the potential barrier into the active region 2 have an energy equal to or greater than that of the satellite conduction band minima while during the negative half cycle of the AC component the potential barrier is lowered so that electrons are emitted over the potential barrier into the active region 2 with an energy less than that of the satellite conduction band minima. During the positive half cycle electrons in the active region 2 are scattered from the main conduction band minimum ($\Gamma$) to the satellite conduction band minima (L) while during the negative half cycle electrons tend to scatter from the satellite conduction band minima (L) to the main conduction band minimum ($\Gamma$). In this example, the injection zone enables the electrons emitted or injected into the active region 2 to be in the appropriate conduction band minimum or minima for operation of the transferred electron effect device whereas, with the arrangements described above with reference to FIGS. 1 and 3, electrons with sufficient energy to surmount the potential barrier P have an energy comparable to that of the conduction band satellite minima of the active region regardless of whether the electrons are emitted into the active region during the positive or the negative half cycle of the AC component.

As a further modification, it may be possible to provide a third electrode or terminal to contact the first region 4 so that the active region 2 and injection zone 3 can be independently biassed enabling the potential across the active region 2 to be switched to provide a field which is either above or below the threshold or critical field so that a microwave output is only provided when the appropriate biasing potential is applied via the third terminal or electrode across the active region 2. Alternatively, with such an arrangement, the potential across the injection zone could be switched to control whether or not electrons with an energy comparable to that of the conduction band satellite minima are emitted into the active region 2. Areas of the first region 4 may be exposed to enable contact to the third terminal using any suitable technique, for example a selective etching technique, conventional in the art.

Although the term barrier region is used herein it should of course be appreciated that the barrier region 6 is, to be more precise, a barrier-defining region in that the region 6 defines the height of the potential barrier P. As will be appreciated from the above, the height of the potential barrier P provided by the barrier region 6 may be adjusted as desired so that electrons passing over the barrier have the desired energies. The barrier height may be adjusted over a wide range by selecting the doping and/or thickness of the barrier region 6 appropriately. In addition to selecting of the doping and/or thickness of the barrier region 6, an additional Knudsen source providing aluminum atoms may be used during the molecular beam epitaxial growth of the barrier region so that the barrier region 6 is formed of an $Al_xGa_{1-x}As$ alloy so providing a band gap discontinuity (as determined by the percentage of aluminum) or heterojunction in addition to the potential barrier provided by the doping. The use of such a heterojunction may enable the proportion of the potential barrier provided by the barrier region 6 to be reduced down to about 0.1 electron volts, so reducing the corresponding potential well for holes in the valence band and thus reducing hole trapping and storage problems.

Although the potential diagrams of FIGS. 2 and 4 indicate that the active region 2 has a uniform doping across its thickness, the dopant concentration may be graded across the active region 2 so as to increase towards the substrate 7 so that the field in the active region 2 is highest closest to the injection zone where oscillation of accumulation of dipole layers is desired. The use of a molecular beam epitaxial growth technique particularly adapts itself to the provision of a graded doping profile as the Knudsen cells used to produce the n-type dopant atoms can be accurately controlled.

As indicated by FIGS. 2 and 4, in the device structures of FIGS. 1 and 3, the first subsidiary region 5a or 50a is more lightly doped than the first region 4. However, taking, for example, the structure indicated by the potential diagram of FIG. 4, the first subsidiary region 50a may be omitted so as to provide an injector zone 3 in which the barrier region 6 is bounded on either side by a relatively highly doped n conductivity type region. Such a structure would have a strongly bias dependent barrier so that the energy of emission of electrons over the barrier increases with bias allowing further improvements in efficiency by enabling electrons with sufficient energy to transfer into the satellite minima (L) to be emitted over the barrier only during that part of the cycle of the induced rf bias during which a domain of negative resistance is formed.

Although the devices described above comprise a gallium arsenide semiconductor body, a transferred electron effect device in accordance with the invention may be manufactured with the active regions 2 formed from any of the semiconductor materials in which the transferred electron effect has been observed, for example indium phosphide or any of the other materials mentioned, for example, on page 648 of the 1981 edition of the text book entitled 'Physics of Semiconductor Devices' second edition by S. M. Sze, with the height of the barrier provided by the barrier region 6 being appropriately tailored for the material concerned so as to be comparable in energy with the separation between the main conduction band and conduction band satellite minima of the material. Also, the injection zone 3 need not necessarily be formed of a material which exhibits a transferred electron effect but could be provided by another semiconductor material (or combination of semiconductor materials if the barrier region 6 is to define heterojunctions with the bounding first and second regions) which provides a suitable lattice match. Thus, for example, where the active region 2 is formed of gallium arsenide, aluminum arsenide could be used in the injection zones.

From reading the present disclosure, other modifications will be apparent to persons skilled in the semiconductor art, for example persons skilled in the design, manufacture and/or use of semiconductor devices.

We claim:

1. A transferred electron effect device comprising a semiconductor body having an active region of n conductivity type formed of a semiconductor material having a relatively low mass, high mobility conduction band main minimum and at least one relatively high mass, low mobility conduction band satellite minimum, and an injection zone adjoining the active region for causing electrons to be emitted, under the influence of an applied electric field, from the injection zone into the active region with an energy comparable to that of a relatively high mass, low mobility, conduction band satellite minimum of the active region, characterized in that the injection zone comprises first and second n conductivity type regions separated by and in contact with a barrier region which has an impurity concentration characteristic of the p conductivity type and which is sufficiently thin as to be fully depleted of free charge carriers under zero bias, at least one of the first and second regions being highly doped relative to the active region at least adjacent the barrier region and the barrier region having a uniform impurity concentration sufficient to provide a potential barrier to the flow of electrons of a height such that, in operation of the device, electrons with sufficient energy to surmount the potential barrier provided by the barrier region are emitted into the active region with an energy comparable to that of a conduction band satellite minimum of the active region.

2. A device according to claim 1, wherein, at least adjacent the barrier region, the first region is more highly doped than the second and active regions.

3. A device according to claim 1 or 2, wherein the second region comprises first and second subsidiary regions and the second subsidiary region is spaced from the barrier region and is more highly doped than the active region and the first subsidiary region.

4. A device according to claim 1 or 2, wherein the first region adjoins the active region.

5. A device according to claim 1, wherein the second region adjoins the active region and comprises first and second subsidiary regions, the second subsidiary region being spaced from the barrier region by the first subsidiary region, the first region and the second subsidiary region being more highly doped than the first subsidiary region and the active region.

6. A transferred electron effect device comprising a semiconductor body having an n conductivity type active region adjacent an anode of the device and formed of a semiconductor material having a relatively low mass, high mobility conduction band main minimum and at least one relatively high mass, low mobility conduction band satellite minimum, and an injection zone adjacent a cathode of the device and adjoining the active region for causing electrons to be emitted, under the influence of a potential difference applied between the anode and the cathode to provide at least a threshold electric field in the active region, from the injection zone into the active region with an energy comparable to that of a relatively high mass, low mobility, conduction band satellite minimum of the active region, characterized in that the injection zone comprises a first n conductivity type region adjoining the active region and separated by a barrier region from a second n conductivity type region comprising first and second subsidiary regions, the second subsidiary region being spaced from the barrier region by the first subsidiary region, the first region and first subsidiary region being in contact with the barrier region, the first region and the second subsidiary region being more highly doped than the first subsidiary region and the active region, and the barrier region being sufficiently thin as to be fully depleted of free charge carriers under zero bias and having a uniform impurity concentration characteristic of the p conductivity type sufficient to provide a potential barrier to the flow of electrons of a height comparable in energy to the energy difference between the main and satellite conduction band minima of the active region with the first region being sufficiently thin that, in operation of the device when the potential difference is applied between the anode and cathode, electrons are thermionically emitted over the potential barrier into the active region with an energy comparable to that of a satellite conduction band minimum of the active region.

7. A device according to claim 1 or 6, wherein the barrier region forms heterojunctions with the first and second regions.

8. A device according to claim 1 or 6, wherein the doping of the active region is uniform.

9. A device according to claim 1 or 6, wherein the doping of the active region is graded so as to decrease towards the injection zone.

10. A device according to claim 1 or 6, wherein the active region is formed of gallium arsenide and the barrier region provides a potential barrier with a height of about 0.3 eV (electron volts).

* * * * *